(12) United States Patent
Wang et al.

(10) Patent No.: US 12,225,769 B2
(45) Date of Patent: Feb. 11, 2025

(54) DISPLAY PANEL AND DISPLAY DEVICE INCLUDING COMPENSATING TRANSISTOR, DRIVE TRANSISTOR AND STORAGE CAPACITANCE

(71) Applicants: Chengdu BOE Optoelectronics Technology Co., Ltd., Sichuan (CN); BOE Technology Group Co., Ltd., Beijing (CN)

(72) Inventors: Miao Wang, Beijing (CN); Yunsheng Xiao, Beijing (CN); Jingwen Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 463 days.

(21) Appl. No.: 17/636,545

(22) PCT Filed: Apr. 29, 2021

(86) PCT No.: PCT/CN2021/090940
§ 371 (c)(1),
(2) Date: Feb. 18, 2022

(87) PCT Pub. No.: WO2022/226882
PCT Pub. Date: Nov. 3, 2022

(65) Prior Publication Data
US 2023/0354642 A1    Nov. 2, 2023

(51) Int. Cl.
*H10K 59/121* (2023.01)
*H10K 59/131* (2023.01)

(52) U.S. Cl.
CPC ...... *H10K 59/1213* (2023.02); *H10K 59/1216* (2023.02); *H10K 59/131* (2023.02)

(58) Field of Classification Search
CPC ........... H10K 59/1213; H10K 59/1216; H10K 59/131; G09G 3/3233; G09G 2310/061;
(Continued)

(56) References Cited

U.S. PATENT DOCUMENTS

2017/0011685 A1   1/2017   Jeon
2017/0077199 A1   3/2017   Nguyen et al.
(Continued)

FOREIGN PATENT DOCUMENTS

CN   103123773 A   5/2013
CN   106896610 A   6/2017
(Continued)

*Primary Examiner* — Changhyun Yi
(74) *Attorney, Agent, or Firm* — WHDA, LLP

(57) ABSTRACT

A display panel and a display device, relate to the technical field of display technology. The present disclosure disposes a plurality of subpixel on a substrate, each subpixel comprises a compensating transistor, a drive transistor, a storage capacitance and a first initialization signal line, a first active pattern of the compensating transistor includes a first active section, a second active section and a third active section, the second active section extends along a first direction, and extension directions of the first active section and the third active section intersect with the first direction; the first initialization signal line extends along the first direction, and an overlapping area exists between an orthogonal projection of the first initialization signal line on the substrate and an orthogonal projection of the second active section on the substrate, the first initialization signal line overlaps with the first active pattern directly to form a coupling capacitance.

20 Claims, 8 Drawing Sheets

(58) Field of Classification Search
CPC ... G09G 2300/0426; G09G 2300/0819; G09G 2300/0861
See application file for complete search history.

(56) References Cited

U.S. PATENT DOCUMENTS

| | | |
|---|---|---|
| 2017/0323598 A1 | 11/2017 | Park et al. |
| 2017/0358641 A1* | 12/2017 | Park ................... H10K 77/111 |
| 2018/0240857 A1* | 8/2018 | Oh ..................... H10K 59/1216 |
| 2019/0213944 A1 | 7/2019 | Zhou |
| 2020/0044009 A1 | 2/2020 | Kwak et al. |
| 2021/0319754 A1 | 10/2021 | Shang et al. |

FOREIGN PATENT DOCUMENTS

| | | |
|---|---|---|
| CN | 108133686 A | 6/2018 |
| CN | 110808265 A | 2/2020 |
| CN | 110930883 A | 3/2020 |
| CN | 111508978 A | 8/2020 |
| CN | 112289267 A | 1/2021 |
| CN | 112289813 A | 1/2021 |
| CN | 112585761 A | 3/2021 |

* cited by examiner

DISPLAY PANEL AND DISPLAY DEVICE INCLUDING COMPENSATING TRANSISTOR, DRIVE TRANSISTOR AND STORAGE CAPACITANCE

TECHNICAL FIELD

The disclosure generally relates to the technical field of display technology, in particular to a display panel and a display device.

BACKGROUND

With the continuous development of the display technology, people have higher requirements for the display devices. When people are pursuing greater and higher visual experience, they are also paying attention to the stability and the uniformity of the luminance of the display devices.

SUMMARY

Some embodiments of the present disclosure provide the following technical solutions:

According to a first aspect, a display panel is provided, includes: a substrate and a plurality of subpixels disposed on the substrate, each of the subpixels includes: a compensating transistor; a drive transistor; a storage capacitance; and a first initialization signal line; a first polar of the compensating transistor is connected with a second polar of the drive transistor, a second polar of the compensating transistor is connected with a gate of the drive transistor and a first polar plate of the storage capacitance, respectively;

a first active pattern of the compensating transistor includes a first active section, a second active section and a third active section which are sequentially connected, the second active section extends along a first direction, and extension directions of the first active section and the third active section intersect with the first direction;

the first initialization signal line extends along the first direction, and an overlapping area exist between an orthogonal projection of the first initialization signal line on the substrate and an orthogonal projection of the second active section on the substrate.

According to a second aspect, a display device is provided, includes the above-mentioned display panel.

The above description is only an overview of the technical scheme of the disclosure. In order to better understand the technical means of the disclosure, the implementation may be carried out in accordance with the contents of the manual, and in order to make the aforesaid and other purposes, features and advantages of the disclosure more obvious and understandable, the specific implementation methods of the disclosure are given below.

BRIEF DESCRIPTION OF THE DRAWINGS

In order to more clearly illustrate the technical solutions of the embodiments of the present disclosure or the prior art, the figures that are required to describe the embodiments or the prior art will be briefly introduced below. Apparently, the figures that are described below are embodiments of the present disclosure, and a person skilled in the art may obtain other figures according to these figures without paying creative work.

DETAILED DESCRIPTION OF THE EMBODIMENTS

In order to make the objects, the technical solutions and the advantages of the embodiments of the present disclosure clearer, the technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
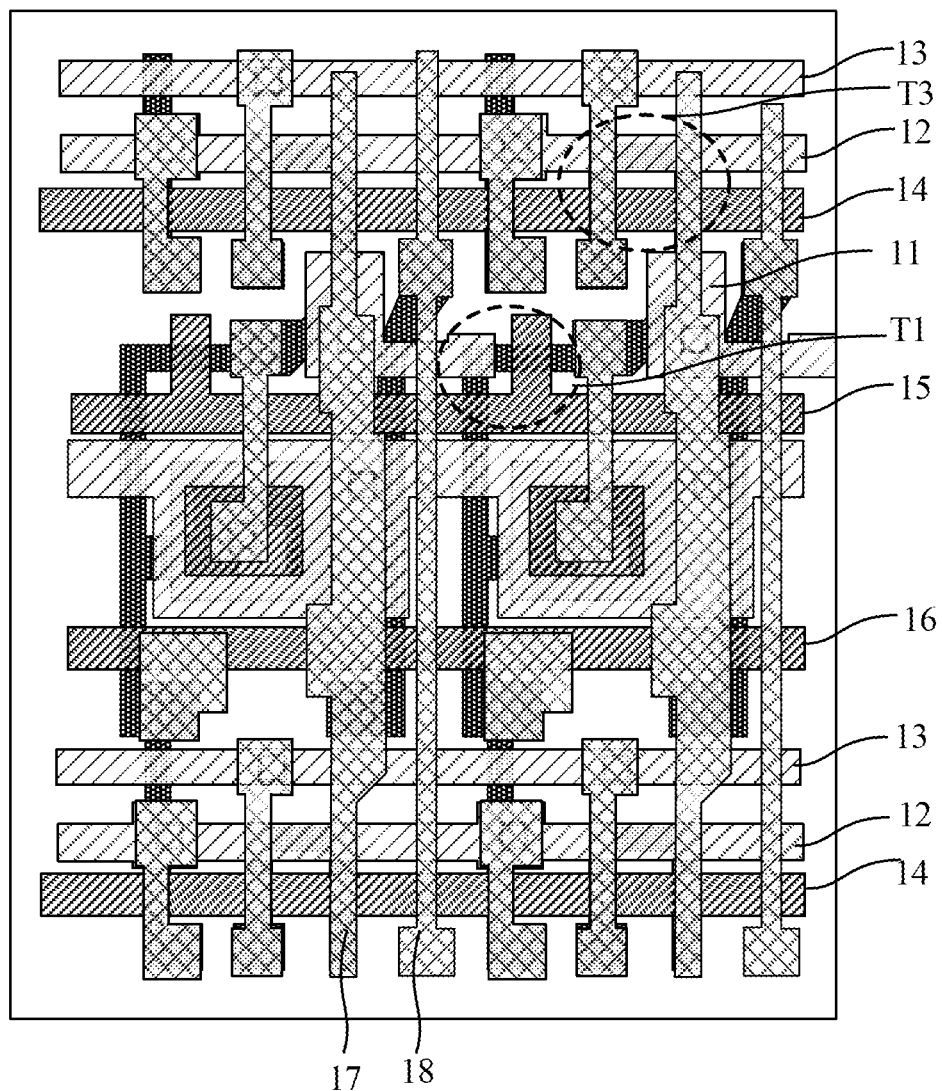
FIG. 1 illustrates a schematic structure of a display panel in related technologies.

In the related technologies, as referring to FIG. 1, each subpixel of the display panel includes: a compensating transistor T1, a first initialization signal line 12, a second initialization signal line 13, a reset signal line 14, a gate line 15, a light control signal line 16, a first source signal line 17 and a data line 18. Wherein, an active pattern of the compensating transistor T1 includes a first active section disposed along the row direction and a second active section disposed along the column direction, that is, the active pattern of the compensating transistor T1 presents a 'L' type distribution, there is also a connection section 11 on a second gate layer where the first initialization signal line 12 is located, the first source signal line 17 is connected to the connection section 11 by a via hole penetrates a interlayer dielectric layer, the corner of the first active section and the second active section of the compensating transistor T1 overlaps with the connection section 11, to form a coupling capacitance.

However, due to a connection section 11 connected to the first source signal line 17 is required to be disposed on the second gate layer additionally, in order to overlap with the active pattern to form the coupling capacitance by penetrating the connection section 11. It will lead to a more complex circuit space layout of each subpixel, so that the circuit layout of each of the subpixels occupies a large space, which reduces the aperture ratio of each of the subpixels.

In the embodiments of the present disclosure, by changing the first active pattern of the compensating transistor, to make the first active pattern include the first active section, the second active section and the third active section which are sequentially connected. The second active section extends along a first direction, the extension directions of the first active section and the third active section are connected with the first direction, and an overlapping area exist between an orthogonal projection of the first initialization signal line on the substrate and an orthogonal projection of the second active section on the substrate. The coupling capacitance is directly formed by the overlapping between the first initialization signal line and the first active pattern of the compensating transistor, at this time, the connection section 11 is not necessary to be disposed additionally. By optimizing the circuit design of the subpixel, the circuit space layout of each of the subpixels is simplified. Accordingly, the space occupied by the circuit layout of each of the subpixels is saved, and the aperture ratio of each of the subpixels is increased.

Figure 2:
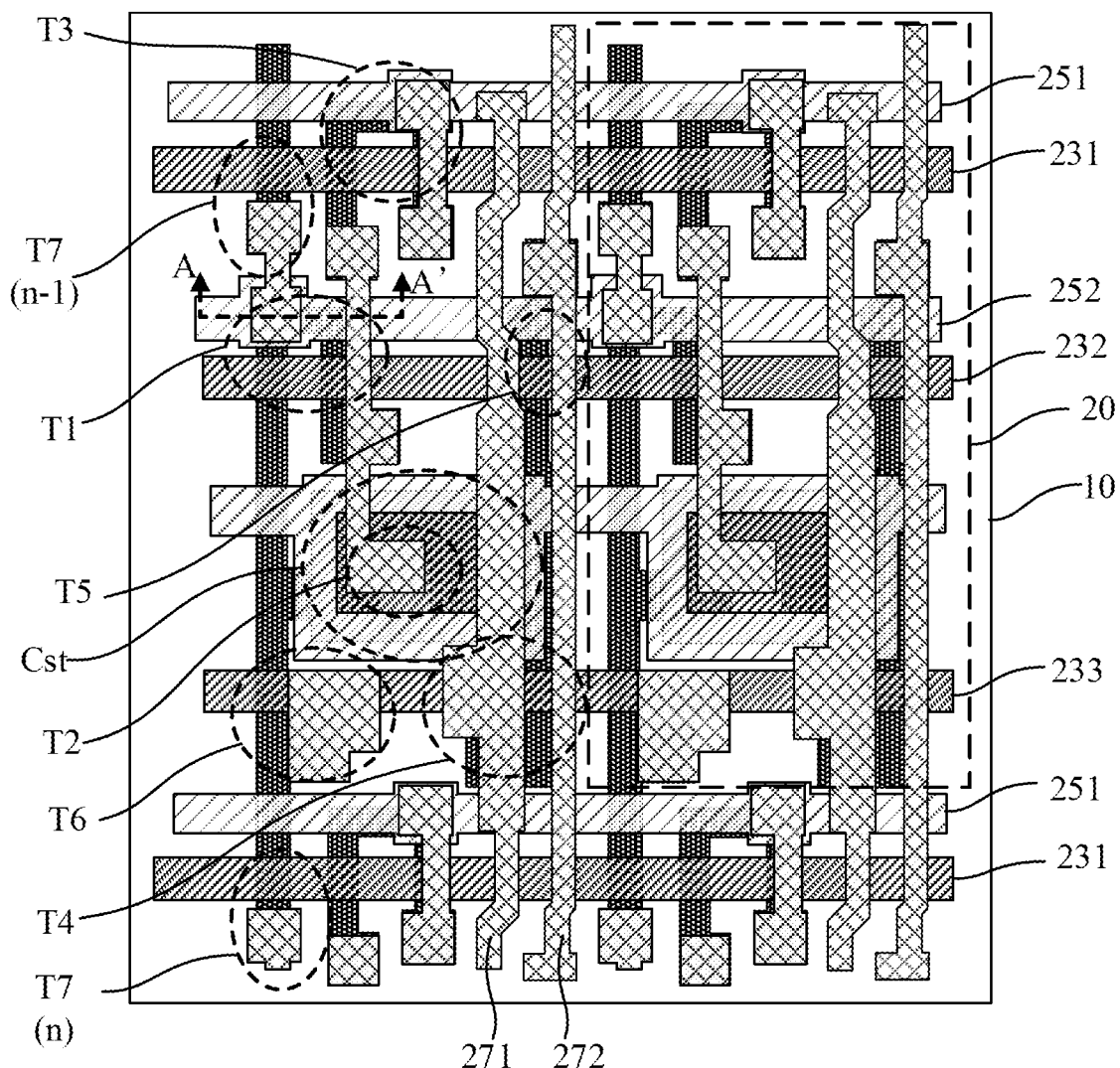
FIG. 2 illustrates a schematic structure of a display panel of the embodiment of the disclosure.
Figure 3:
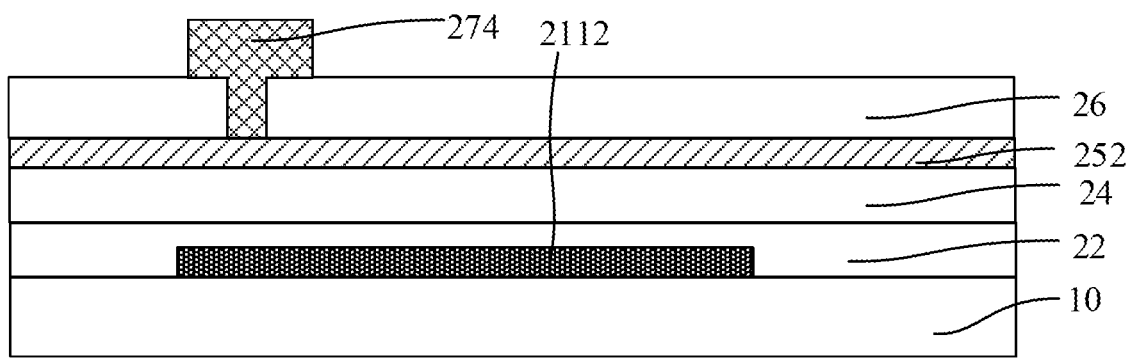
FIG. 3 illustrates a profile of display panel along the cross-section A-A' shown in FIG. 2.
Figure 4:
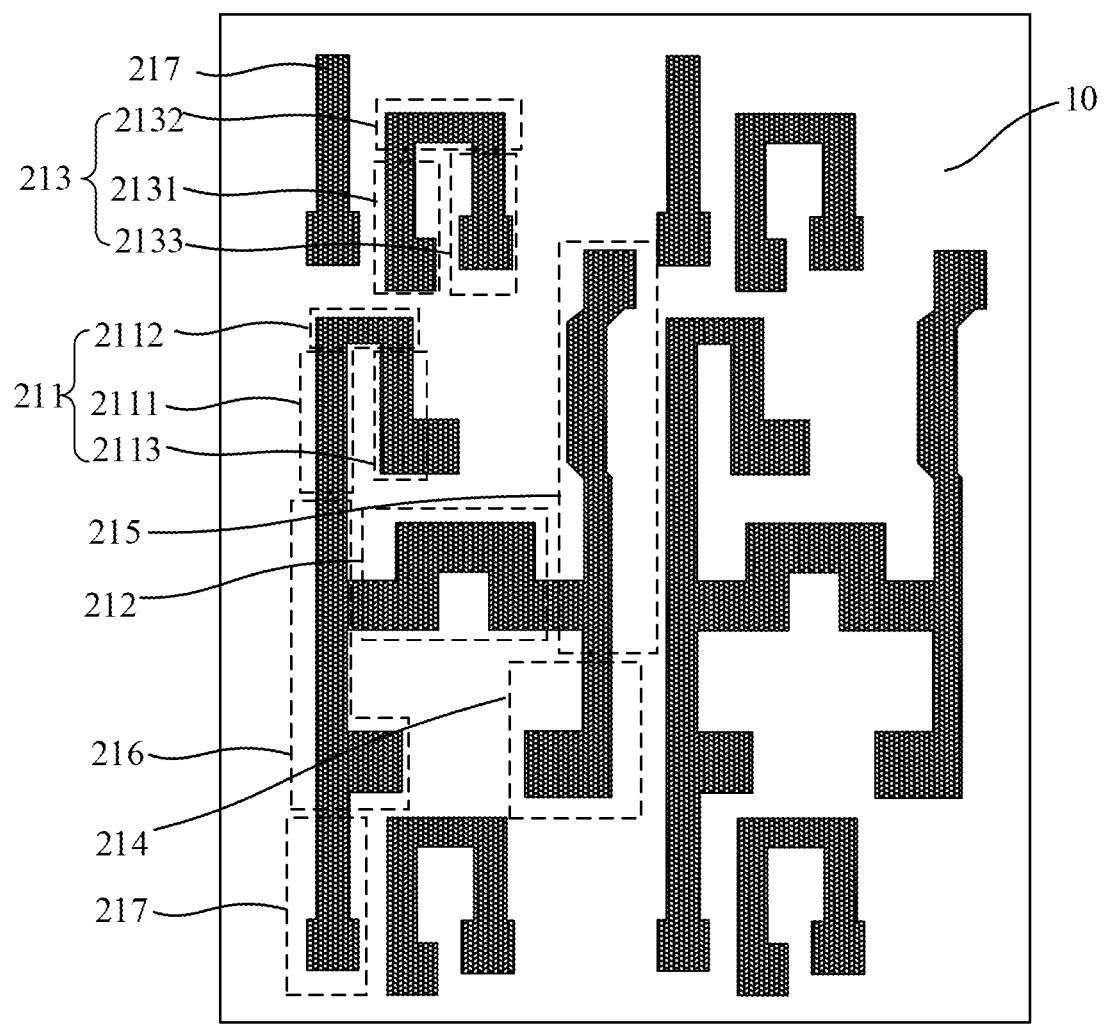
FIG. 4 illustrates a schematic structure of active layer on the display panel of the embodiment of the disclosure.

As referring to FIG. 2, a schematic structure of a display panel in the embodiments of the present disclosure is shown. FIG. 3 illustrates a profile of display panel along the cross-section A-A' shown in FIG. 2. FIG. 4 illustrates a schematic structure of active layer on the display panel of the embodiment of the disclosure.

The embodiments of the present disclosure discloses a display panel, includes: a substrate 10 and a plurality of subpixels 20 disposed on the substrate 10, each of the subpixels 20 includes: a compensating transistor T1, a drive transistor T2, a storage capacitance Cst and a first initialization signal line 252; a first polar of the compensating transistor T1 is connected with a second polar of the drive transistor T2, a second polar of the compensating transistor T1 connected with a gate of the drive transistor T2 and a first polar plate of the storage capacitance Cst, respectively.

Wherein, a first active pattern 211 of the compensating transistor T1 includes a first active section 2111, a second active section 2112 and a third active section 2113 which are sequentially connected, the second active section 2112 extends along a first direction, and extension directions of the first active section 2111 and third active section 2113 intersect with the first direction; the first initialization signal line 252 extends along the first direction, an overlapping area exist between an orthogonal projection of the first initialization signal line 252 on the substrate 10 and an orthogonal projection of the second active section 2112 on the substrate 10.

In practical products, the substrate 10 may be a rigid substrate, such as a glass substrate and so on. The substrate 10 may be also a flexible substrate, such as a polyimide (PI) substrate and so on, the plurality of subpixels 20 are distributed on the substrate 10, and each of the subpixels 20 is array distributed.

Wherein, each of the subpixels 20 includes the compensating transistor T1, the drive transistor T2 and the storage capacitance Cst. The drive transistor T2 refers to the transistor that drives light emitting sections to emit light; the compensating transistor T1 refers to the transistor that compensates the threshold voltage of the drive transistor T2, the compensating transistor T1 is connected between the gate and the second polar of the drive transistor T2, the compensating transistor T1 is a dual gate transistor to reduce the leakage current of the compensating transistor T1 and improve the stability of the gate voltage of the drive transistor T2; The first polar plate of the storage capacitance Cst is connected to the gate and the second polar of the drive transistor T1, respectively, to store a written voltage. In the process of driving the light emitting sections to emit light by the drive transistor T2, the drive transistor T2 is maintained in the conducting state by discharging.

As referring to FIG. 4, the first active pattern 211 of the compensating transistor T1 includes the first active section 2111, the second active section 2112 and the third active section 2113, and the second active section 2112 extends along the first direction, the extension directions of the first active section 2111 and the third active section 2113 intersect with the first direction, to make the first active pattern 211 present a 'U' type distribution.

Moreover, the first initialization signal line 252 extends along the first direction, that is, the first initialization signal line 252 is parallel to the second active section 2112 in the first active pattern 211, and the first direction actually refers to the row direction of the display panel. The overlap areas between the orthogonal projection of the first initialization signal line 252 and the orthogonal projection of the second active section 2112 on the substrate 10, it makes the first initialization signal line 252 overlap the second active section 2112 in the first active pattern 211 to form the coupling capacitance.

By changing the first active pattern 211 of the compensating transistor T1, the first active pattern 211 includes the first active section 2111, the second active section 2112 and the third active section 2113 which are sequentially connected. And the coupling capacitance is directly formed by overlapping the first initialization signal line 252 and the first active pattern 211 of the compensating transistor T1. At this time, the connection section 11 is not necessary to be disposed additionally. By optimizing the circuit design of the subpixels 20, the circuit space layout of each of the subpixels 20 is simplified. Accordingly, the space occupied by the circuit layout of each of the subpixels 20 is saved, and the aperture ratio of the each of the subpixels 20 is increased.

Optionally, the orthogonal projection of the first initialization signal line 252 on the substrate 10 covers the orthogonal projection of the second active section 2112 on the substrate 10.

In the related technologies shown in the FIG. 1, the corner position of the first active section and the second active section of the compensating transistor T1 overlaps with the connection section 11, that results smaller an overlapping area between the active pattern of the compensating transistor T1 and the connection section 11, and the capacitance value of the formed coupling capacitance is also relatively small. When the capacitance value of the coupling capacitance is small, the voltage of the active pattern of the compensating transistor T1 may not be stabilized for a long time at a low refresh frequency, which makes the voltage provided by the storage capacitance to the drive transistor stable and results in a poor stability and a uniformity of the luminance of each of the subpixels.

In the embodiments of the present disclosure, when the orthogonal projection of the first initialization signal line 252 on the substrate 10 covers the orthogonal projection of the second active section 2112 on the substrate 10, the overlapping areas between the first initialization signal line 252 and the first active pattern 211 of the compensating transistor T1 are increased, then the capacitance value of the formed coupling capacitance is larger. Since the voltage inputted by the first initialization signal line 252 to the first initialization signal is constant, which is always a first initialization signal voltage, it makes the voltage of the first active pattern 211 constant. The voltage of the first active pattern 211 is not affected by other signal jumps in the display panel. At a low refresh frequency, the duration of each frame is longer. When the capacitance value of the coupling capacitance formed by the first initialization signal line 252 and the first active pattern 211 of the compensating transistor T1 is larger, the voltage of the first active pattern 211 of the compensating transistor T1 may also be stabilized in a long time, the voltage provided by the storage capacitance Cst to the drive transistor T2 is more stable, thereby the stability and the uniformity of the luminance of each of the subpixels 20 is improved.

Certainly, the display panel of the embodiments in the present disclosure may also be applied to scenes with a high refresh frequency, and it may also improve the stability and the uniformity of the luminance of each of the subpixels 20 under the high refresh frequency.

In some embodiments, the first initialization signal line 252 overlaps only with the second active section 2112 to form the coupling capacitance, but the first initialization signal line 252 does not overlap with the first active section 2111 and the third active section 2113, that is, an overlapping area only exist between the orthogonal projection of the first initialization signal line 252 on the substrate 10 and the orthogonal projection of the second active section 2112 on substrate 10; at this time, along the second direction, the width of the first initialization signal line 252 is less than or equal to the width of the second active section 2112.

It should be noted that when the orthogonal projection of the first initialization signal line 252 on the substrate 10 only overlaps with the orthogonal projection of the second active section 2112 on substrate 10, the width of the first initialization signal line 252 is equal to the width of the second active section 2112; when an overlapping area only exist between the orthogonal projection of the first initialization signal line 252 on the substrate 10 and the orthogonal projection of the partly second active section 2112 on substrate 10, the width of the first initialization signal line 252 is less than the width of the second active section 2112.

In other embodiments, an overlapping area exist between the orthogonal projection of the first initialization signal line 252 on the substrate 10 and the orthogonal projection of the first active section 2111 and the third active section 2113 on the substrate 10.

Optionally, in addition to overlap with the second active section 2112, the first initialization signal line 252 also overlaps with some first active sections 2111 and some third active sections 2113, it makes an overlapping area between the first initialization signal line 252 and the first active pattern 211 of the compensating transistor T1 increased, it also makes the capacitance value of the formed coupling capacitance increased, it further improves the stability and the uniformity of the luminance of each of the subpixels 20. At this time, along the second direction, the width of the first initialization signal line 252 is greater than the width of the second active section 2112.

In the alternative embodiment of the disclosure, as referring to FIG. 4, the extension directions of the first active section 2111 and the third active section 2113 are parallel to each other.

Wherein, the first direction is the row direction of the display panel, all of the extension directions of the first active section 2111 and the third active section 2113 are the second direction, and the second direction intersects with the first direction.

Specifically, the second direction may be vertical to the first direction, at this time, the second direction is the column direction of the display panel, the first active section 2111 and the third active section 2113 extend both along the column direction of the display panel, at this time, the position, which the first active section 2111 and second active section 2112 are connected, is a right angle, the position, which the third active section 2113 and second active section 2112 are connected, is also a right angle; moreover, the first active section 2111 and the third active section 2113 are all located on the same side of the second active section 2112.

It should be noted that the second direction may be perpendicular to the first direction, it should be known, the angle between the second direction and the first direction is within the preset angle range, such as the preset angle range is from 85° to 95°, optionally, the preset angle range is 90°.

Certainly, the second direction may not be perpendicular to the first direction, at this time, the angle between the second direction and the first direction is greater than or smaller than the first preset angle. For example, the first preset angle is 95°, and the second preset angle is 85°.

Additionally, the third active section 2113 includes a third convex section back away from the side of the first active section 2111. The third convex is convenient for the third connection section disposed on the source-drain electrode layer to connect with the third active section 2113 in the first active pattern 211 by penetrating the interlayer dielectric layer 26, the seventh via hole of the second gate insulation layer 24 and the first gate insulation layer 22.

In another optional embodiment of the disclosure, the extension direction of the first active section 2111 is a third direction, and the extension direction of the third active section 2113 is a fourth direction, and the third direction intersects with the fourth direction.

Wherein, the extension direction of the second active section 2112 is the first direction, and the first direction is the row direction of the display panel. The extension direction of the first active section 2111 is not parallel to that of the third active section 2113. Moreover, the extension directions of the first active section 2111 and the third active section 2113 intersect with the first direction. At this time, the position, where the first active section 2111 connects with the second active section 2112, is presented as an acute angle or a blunt angle, and the position, where the third active section 2113 connects with the second active section 2112, is also presented as an acute angle or a blunt angle.

For example, at the position where the first active section 2111 connects with the second active section 2112, the angle between the first active section 2111 and the second active section 2112 is 100°, and at the position where the third active section 2113 connects with the second active section 2112, the angle between the third active section 2113 and the second active section 2112 is also 100°.

In the embodiments of the present disclosure, each of the subpixels 20 further includes a gate line 232, a reset signal line 231, a second initialization signal line 251, a light control signal line 233, a first source signal line 271 and a data line 272; the gate line 232, the reset signal line 231, the second initialization signal line 251 and the light control signal line 233 all extend along the first direction, the first source signal line 271 and the data line 272 both extend along a second direction, the second direction intersects with the first direction.

Wherein, the second direction may be perpendicular to the first direction, at this time, the first direction is the row direction of the display panel, the second direction is the column direction of the display panel. The gate line 232, the reset signal line 231, the second initialization signal line 251 and light control signal line 233 extend along the row direction, and there is no overlapping area exist in the orthogonal projections of the first initialization signal line 252, the gate line 232, the reset signal line 231, the second initial signal line 251 and the light control signal line 233 on the substrate 10; The first source signal line 271 and the data line 272 extend along the column direction, and there is no an overlapping area exist in the orthogonal projections of the first source signal line 271 and the data line 272 on the substrate 10 neither.

It should be noted that the second direction is perpendicular to the first direction, which may be understood as the angle between the second direction and the first direction is within the preset angle range, such as the preset angle range from 85° to 95°.

As referring to FIG. 2, in each of the subpixels 20, the reset signal line 231 is located between the first initialization signal line 252 and the second initialization signal line 251, the first initialization signal line 252 is located between the reset signal line 231 and the gate line 232, and the gate line 232 is located between the first initialization signal line 252 and the light control signal line 233.

The first initialization signal line 252 and the second initialization signal line 251 in each of the subpixels 20 are separately disposed, which are separated by the reset signal line 231 between them, it makes the first initialization signal line 252 more convenient to overlap with the first active pattern 211 of the compensating transistor T1 to form the coupling capacitance.

In practical products, the gate of the compensating transistor T1 is controlled by the gate line 232, and the gate of the compensating transistor T1 is a section of the gate line 232 that is overlapped with the first active section 2111 and the third active section 2113.

Wherein, the gate line 232 may be directly used as the gate of the compensating transistor T1, which makes the circuit layout of the subpixels 20 simpler. Certainly, a gate is also may be disposed to the compensating transistor T1 additionally, and the gate of the compensating transistor T1 connects with the gate line 232.

Besides, at the position where the first active section 2111 connects with the second active section 2112, the first initialization signal line 252 includes a first convex section facing the gate line 232 and a second convex section back away from the gate line 232; moreover, at other positions other than the position where the first active section 2111 connects with the second active section 2112, the widths of the first initialization signal line 252 along the second direction are equal.

Since the first initialization signal line 252 also connects with the first polar of the second reset transistor T7, and the second connection section 274 disposed on the source-drain electrode layer connects to the first initialization signal line 252 by the sixth via hole penetrates the interlayer dielectric layer 26, to implement the connection between the first initialization signal line 252 and the first polar of the second reset transistor T7 on the position of the first active section 2111 connected with the second active section 2112, so the first initialization signal line 252 is needed to be disposed as a first convex section facing the gate line 232 and a second convex section back away from the gate line 232; other positions of the first initialization signal line 252 are not need to connect with the other structures, therefore, at the other positions other than the position of the first active section 2111 connected with the second active section 2112, the widths of the first initialization signal line along the column direction are set to be equal.

As referring to FIG. 2, each of the subpixels 20 further includes a first reset transistor; a gate of the first reset transistor T3 is controlled through the reset signal line 231, a first polar of the first reset transistor T3 is connected with the second initialization signal line 251, a second polar of the first reset transistor T3 is connected with the second polar of the compensating transistor T1.

At this time, the second polar of the first reset transistor T3 is also connected to the first polar plate of the storage capacitance Cst and the gate of the drive transistor T2, the first reset transistor T3 is used to conduct under the control of the reset signal input by the reset signal line 231. The second initialization signal provided by the second initialization signal line 251 is transmitted to the first polar plate of the storage capacitance Cst and the gate of the drive transistor T2, to reset the gate of the storage capacitance Cst and drive transistor T2.

Wherein, the first reset transistor T3 refers to a dual gate transistor; As referring to FIG. 4, a second active pattern of the first reset transistor T3 includes a fourth active section 2131, a fifth active section 2132 and a sixth active section 2133 which are sequentially connected, the fifth active section 2132 extends along the first direction, and extension directions of the fourth active section 2131 and the sixth active section 2133 intersect both with the first direction; the gate of the first reset transistor T3 refers to a section of the reset signal line 231 that is overlapped with the fourth active section 2131 and the sixth active section 2133.

When the first reset transistor T3 is the dual gate transistor, the leakage current of the first reset transistor T3 may be reduced, thereby the stability of the gate voltage of the drive transistor T2 is improved.

Moreover, a second active pattern 213 of the first reset transistor T3 includes a fourth active section 2131, a fifth active section 2132 and a sixth active section 2133 which are sequentially connected, the fifth active section 2132 extends along the first direction, the first direction is the row direction of the display panel, and extension directions of the fourth active section 2131 and the sixth active section 2133 intersect both with the first direction, so that the second active pattern 213 also presents a 'U' type distribution.

Optionally, the extension directions of the fourth active section 2131 and the sixth active section 2133 are parallel to each other, and the extension directions of the fourth active section 2131 and the sixth active section 2133 are both the column direction of the display panel, so that the angle of the position where the fourth active section 2131 connected to the fifth active section 2132 is a right angle, and the angle of the position where the sixth active section 2133 connected to the fifth active section 2132 is also a right angle. Moreover, the fourth active section 2131 and the sixth active section 2133 are both located on the side of the fifth active section 2132 facing the first initialization signal line 252.

Specifically, the fourth active section 2131 further includes a fourth convex section facing the first source signal line 271, so that the third connection section disposed on the source-drain electrode layer connects to the fourth active section 2131 of the second active pattern 213 by a third via hole that penetrates the interlayer dielectric layer 26, the second gate insulation layer 24 and the first gate insulation layer 22, the sixth active section 2133 includes a fifth convex section facing the fourth active section 2131 and a sixth convex section back away from the fourth active section 2131, so that the first connection section disposed on the source-drain electrode layer connects to the sixth active section 2133 of the second active pattern 213 by a fourth via hole that penetrates the interlayer dielectric layer 26, the second gate insulation layer 24 and the first gate insulation layer 22.

Additionally, the gate of the first reset transistor T3 refers to the overlapping area in the reset signal line 231 with the fourth active section 2131 and the sixth active section 2133, that is, the reset signal line 231 is used as the gate of the first reset transistor T3, to simplify the circuit layout of the subpixels 20.

Certainly, the gate of the first reset transistor T3 may be disposed additionally, the gate of the first reset transistor T3 is connected with the reset signal line 231.

In the embodiments of the present disclosure, there is no overlapping area exist between the orthogonal projection of the second active pattern 213 on the substrate 10 and the orthogonal projection of the first source signal line 271 on the substrate 10.

Therefore, in related arts, the first source signal line 271 is required to be connected with the connection section 11, and the demand of the circuit space layout makes the active pattern of the first reset transistor T3 shown in the FIG. 1 overlap with the first source signal line 271; and it is not necessary to dispose a connection section 11 in the embodiments of the present disclosure, the first source signal line 17 is not necessary to be connected with the connection section 11, so that the load of the first source signal line 17 is reduced and the display effect of the display panel is improved. According to the circuit space layout, there is no an overlapping area exist between the orthogonal projection of the second active pattern 213 on the substrate 10 and the orthogonal projection of the first source signal line 271 on the substrate 10.

As referring to FIG. 2, each of the subpixels 20 further includes a first light control transistor T4; a gate of the first light control transistor T4 is controlled through the light control signal line 233, a first polar of the first light control transistor T4 is connected with the first source signal line 271, a second polar of the first light control transistor T4 is connected with a first polar of the drive transistor T2; the first source signal line 271 is also connected with the second polar plate of the storage capacitance Cst.

As referring to FIG. 4, an active pattern 214 of the first light control transistor T4 includes a first main section and a seventh convex section which are interconnected, the first main section extends along the column direction, an overlapping area exist between the first main section and the light control signal line 233, and the gate of the first light control transistor T4 refers to a section where the overlapping area exists between the light control signal line 233 and the first main section of the active pattern 214; along the row direction of the display panel, the seventh convex section of the active pattern 214 is located on the side facing the first active pattern 211 in the first main section of the active pattern 214, the seventh convex section of the active pattern 214 is arranged, to make the first source signal line 271 disposed on the source-drain electrode layer connect with the seventh convex section of the active pattern 214 by a eleventh via hole that penetrates the interlayer dielectric layer 26, the second gate insulation layer 24 and the first gate insulation layer 22.

As referring to FIG. 2, each of the subpixels 20 further includes a data insertion transistor T5; a gate of the data insertion transistor T5 is controlled by the gate line 232, a first polar of the data insertion transistor T5 is connected with the data line 272, a second polar of the data insertion transistor T5 is connected with the first polar of the drive transistor T2.

As referring to FIG. 4, an active pattern 215 of the data insertion transistor T5 extends the column direction of the display panel, the gate of the data insertion transistor T5 refers to a section where an overlapping area exist in the gate line 232 and the active pattern 215, and the active pattern 215 of the data insertion transistor T5 is connected with the first main section of the active pattern 214 in the first light control transistor T4.

As referring to FIG. 2, each of the subpixels 20 further includes a second light control transistor T6 and a light emitting section; a gate of the second light control transistor T6 is controlled by the light control signal line 233, a first polar of the second light control transistor T6 is connected with the second polar of the drive transistor T2, a second polar of the second light control transistor T6 is connected with a first polar of the light emitting section.

As referring to FIG. 4, an active pattern 216 of the second light control transistor T6 includes a second main section and a eighth convex section which are interconnected, the second main section extends the column direction, an overlapping area exist between the second main section and the light control signal line 233, and the gate of the second light control transistor T6 refers to a section where the overlapping area exists in the light control signal line 233 and the second main section of the active pattern 216; along the row direction of the display panel, the eighth convex section of the active pattern 216 is located on the side facing the first source signal line 271 in the second main section of the active pattern 216, the eighth convex section of the active pattern 216 is arranged, to make the fourth connection section disposed on the source-drain electrode layer connect with the eighth convex section of the active pattern 216 by the tenth via hole that penetrates the interlayer dielectric layer 26, the second gate insulation layer 24 and the first gate insulation layer 22.

Wherein, a second main section in the active pattern 216 of the second light control transistor T6 is connected with the first active section 2111 of the first active pattern 211; and the active pattern 212 of the drive transistor T2 is located between the active pattern 216 of the second light control transistor T6 and the active pattern 215 of the data insertion transistor T5, and the active pattern 212 of the drive transistor T2 is connected with the active pattern 216 of the second light control transistor T6 and the active pattern 215 of the data insertion transistor T5, respectively.

As referring to FIG. 2, each of the subpixels 20 further includes a second reset transistor T7; a gate of the second reset transistor T7 is controlled by the reset signal line 231, a first polar of the second reset transistor T7 is connected with the first initialization signal line 252, a second polar of the second reset transistor T7 is connected with the first polar of the light emitting section.

As referring to FIG. 4, an active pattern 217 of the second reset transistor T7 extends along column direction of the display panel, in each of the subpixels 20, the active pattern 217 of the second reset transistor T7 is located at the active pattern 216 of the second light control transistor T6 far away from the side of the first active pattern 211, and the active pattern 217 of the second reset transistor T7 is connected with the active pattern 216 of the second light control transistor T6; the gate of the second reset transistor T7 refers to a section where the overlapping area exists in the reset signal line 231 and the active pattern 217.

And, the active pattern 217 of the second reset transistor T7 includes a ninth convex section facing the first source signal line 271 and a tenth convex section back away from the first source signal line 271, the ninth convex section and the tenth convex section are arranged, to make the second connection section 274 disposed on the source-drain electrode layer connect with the active pattern 217 of the second reset transistor T7 by a second via hole that penetrates the interlayer dielectric layer 26, the second gate insulation layer 24 and the first gate insulation layer 22.

In practical products, in the subpixels 20 of the row n, the reset signal line 231 connect to the first reset transistor T3 is the reset signal line 231 in the subpixel 20 of the row in the reset signal line 231 connected to the second reset transistor T7 is the reset signal line 231 in the subpixels of a row n+1, and the reset signal line 231 connected to the second reset transistor T7 is connected with the gate line 232 in the subpixels 20 of the row n; the n is a positive integer greater than 0.

FIG. 2 illustrates a schematic structure of the subpixels 20 in any two adjacent columns of the row n, it may be seen, the second reset transistor T7 in the subpixels 20 of the row n−1, that is T7(n−1) which is connected with the reset signal line 231 in the subpixels 20 of the row n, and the second reset transistor T7 in the subpixels 20 of the row n, that is T7(n) which is connected with the reset signal line 231 in the subpixels 20 of the row n+1; additionally, the gate line 232 in the subpixels 20 of the row n is connected with the reset signal line 231 in the subpixels 20 of the row n+1.

It should be noted that the second active pattern 213 of the first reset transistor T3 is disconnected with the first active pattern 211 of the compensating transistor T1, the active pattern 212 of the drive transistor T2, the active pattern 214 of the first light control transistor T4, the active pattern 215 of the data insertion transistor T5, the active pattern 216 of the second light control transistor T6 and the active pattern 217 of the second reset transistor T7.

In the embodiments of the present disclosure, the first active pattern 211 is located in the active layer, the gate line 232, the reset signal line 231, the light control signal line 233 and the first polar plate 234 of the storage capacitance Cst are all located on the first gate layer, the first initialization signal line 252, the second initialization signal line 251 and the second polar plate 253 of the storage capacitance Cst are located in the second gate layer, the first source signal line 271 and the data line 272 are located in the source-drain electrode layer; the first gate insulation layer 22 is disposed between the first gate layer and the active layer, the second gate insulation layer 24 is disposed between the second gate layer and the first gate layer, the interlayer dielectric layer 26 is disposed between the source-drain electrode layer and the second gate layer, and the source-drain electrode layer is located in the interlayer dielectric layer 26 away from the side of the substrate 10.

Wherein, as referring to FIG. 4, the first active pattern 211 of the compensating transistor T1, the active pattern 212 of the drive transistor T2, the second active pattern 213 of the first reset transistor T3, the active pattern 214 of the first light control transistor T4, the active pattern 215 of the data insertion transistor T5, the active pattern 216 of the second light control transistor T6 and the active pattern 217 of the second reset transistor T7 are all located in the active layer.

Figure 5:
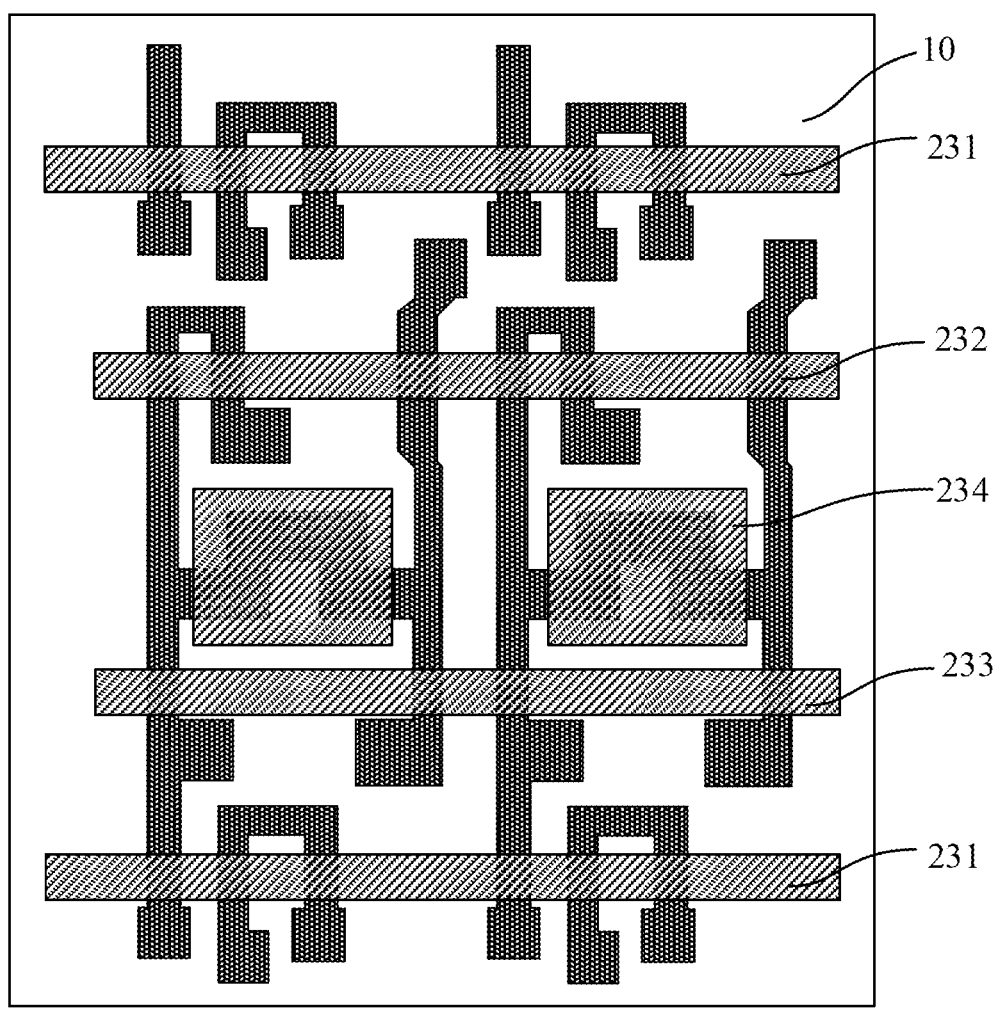
FIG. 5 illustrates a schematic structure of an active layer and a first gate layer on the display panel of the embodiment of the disclosure.

As referring to FIG. 5, along the column direction of the display panel, the widths of each region of the gate line 232 are all equal, the widths of each region of the reset signal line 231 are all equal, the widths of each region of the light control signal line 233 are all equal; in the each of the subpixels 20, the gate line 232 is located between the first initialization signal line 252 and the light control signal line 233, the first polar plate 234 of the storage capacitance Cst is disposed between the gate line 232 and the light control signal line 233, the shape of the orthogonal projection of the first polar plate 234 on the substrate 10 is a rectangle; and the gate line 232, the reset signal line 231, the light control signal line 233 and the first polar plate 234 of the storage capacitance Cst are all located in the first gate layer.

In addition, an overlapping area exist between the reset signal line 231 and the fourth active section 2131 and the sixth active section 2133 in the second active pattern 213 of the first reset transistor T3, an overlapping area also exist between the reset signal line 231 and the active pattern 217 of the second reset transistor T7; an overlapping area exist between the gate line 232 and the first active section 2111 and third active section 2113 in the first active pattern 211 of the compensating transistor T1, an overlapping area exist between the gate line 232 and the active pattern 215 of the data insertion transistor T5; an overlapping area exist between the first polar plate 234 of the storage capacitance Cst and the active pattern 212 of the drive transistor T2; and an overlapping area exist between the light control signal line 233 and the active pattern 216 of the second light control transistor T6 and the active pattern 214 of the first light control transistor T4.

Figure 6:
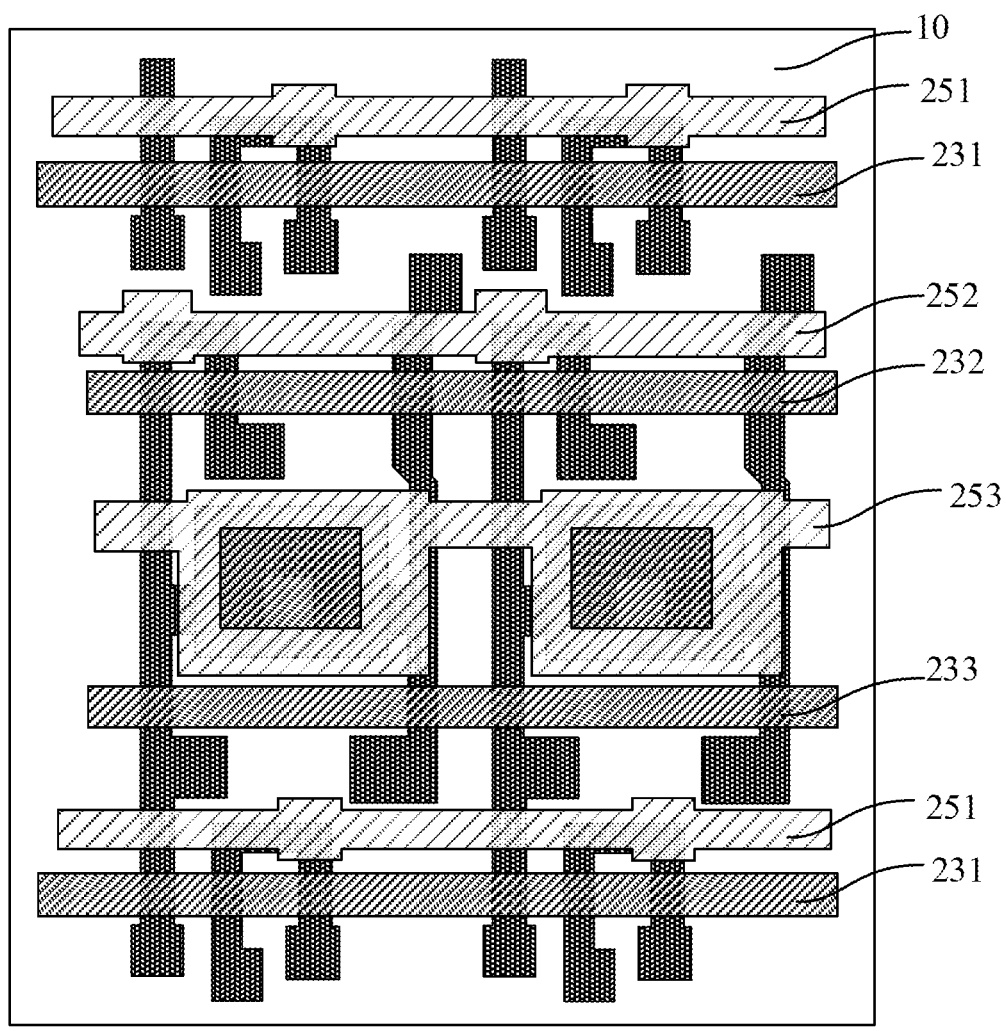
FIG. 6 illustrates a schematic structure of an active layer, a first gate layer and a second gate layer on the display panel of the embodiment of the disclosure.

As referring to FIG. 6, in each of the subpixels 20, the reset signal line 231 is located between the second initialization signal line 251 and the first initialization signal line 252, the second polar plate 253 of the storage capacitance Cst is located in the first initialization signal line 252 away from the side of the second initialization signal line 251, the first initialization signal line 252, the second initialization signal line 251 and the second polar plate 253 of the storage capacitance Cst are all located on the second gate layer.

wherein, at the position where the fifth active section 2132 of the second active pattern 213 is connected with the sixth active section 2133, the second initialization signal line 251 includes a eleventh convex section facing the side of the first initialization signal line 252 and a twelfth convex section back away from the side of the first initialization signal line 252, it makes the first connection section connect with the second initialization signal line 251 by a first via hole that penetrates the interlayer dielectric layer 26, at the other positions other than the position where the fifth active section 2132 and the sixth active section 2133 are connected, the widths of the second initialization signal line 251 along the second direction are all equal.

The second polar plate 253 of the storage capacitance Cst is provided with a perforative opening, an overlapping area exist between the orthogonal projection of the opening on the substrate 10 and the orthogonal projection of the first polar plate 234 of the storage capacitance Cst on the substrate 10, it is convenient for, at the opening of the second polar plate 253, the third connection section disposed on the source-drain electrode layer may connect with the first polar plate 234 of the storage capacitance Cst by a eighth via hole that penetrates the interlayer dielectric layer 26 and the second gate insulation layer 24; and an overlapping area exist between the orthogonal projection of second polar plate 253 at other position other than the opening on the substrate 10 and the orthogonal projection of the first polar plate 234 on the substrate 10, so that the storage capacitance Cst is formed through the first polar plate 234 and second polar plate 253.

Figure 7:
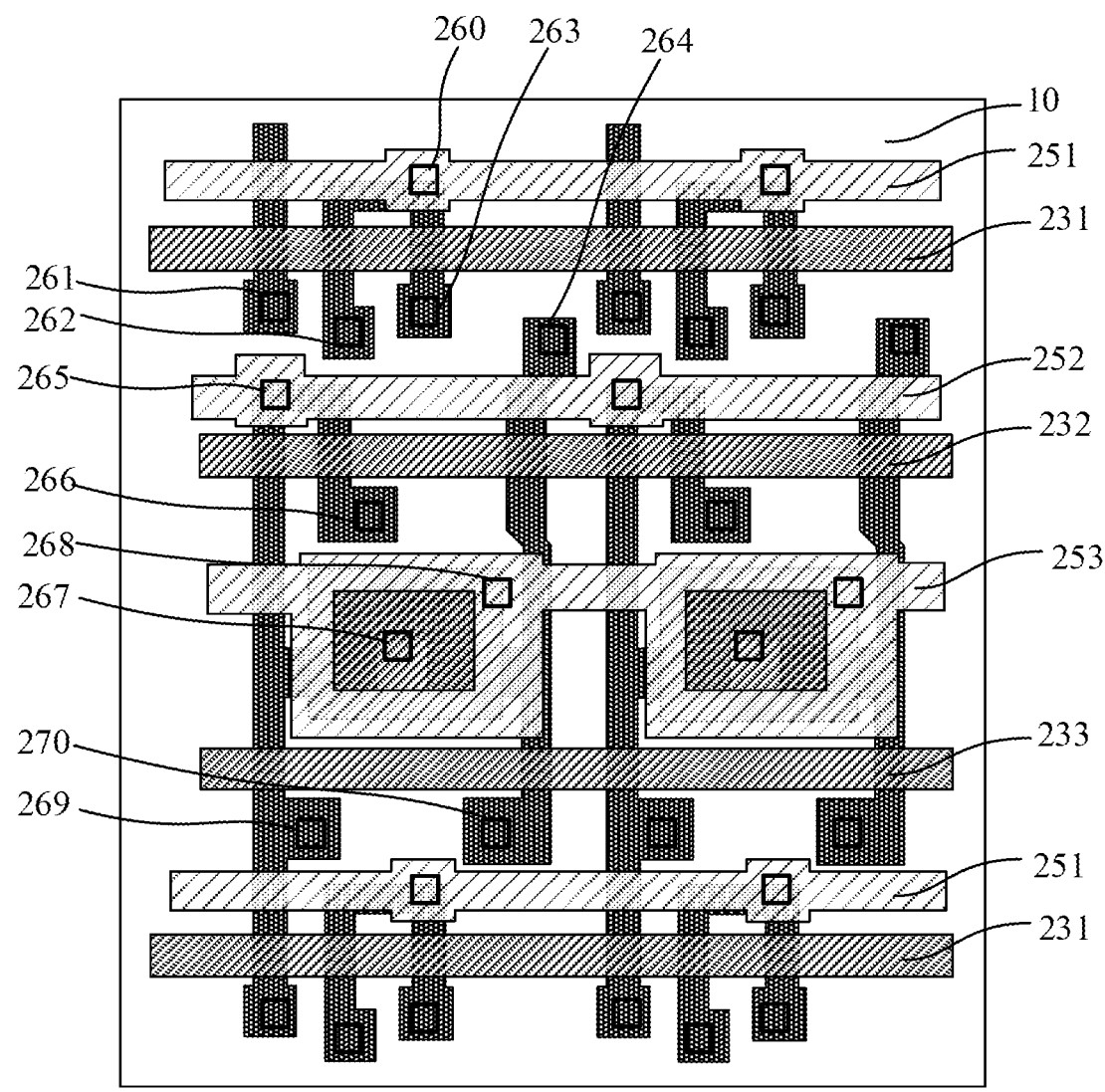
FIG. 7 illustrates a schematic structure of an active layer, a first gate layer, a second gate layer, and each of the through holes on the display panel of the embodiment of the disclosure.

As referring to FIG. 7, the number 260 refers to the first via hole that penetrates the interlayer dielectric layer 26, the first via hole 260 exposes the second initialization signal line 251; the number 261 refers to the second via hole that penetrates the interlayer dielectric layer 26, the second gate insulation layer 24 and the first gate insulation layer 22, the second via hole 261 exposes the active pattern 217 of the second reset transistor T7; the number 262 refers to the third via hole that penetrates the interlayer dielectric layer 26, the second gate insulation layer 24 and the first gate insulation layer 22, the third via hole exposes the fourth active section 2131 in the second active pattern 213 of the first reset transistor T3; the number 263 refers to the fourth via hole that penetrates the interlayer dielectric layer 26, the second gate insulation layer 24 and the first gate insulation layer 22, the fourth via hole 263 exposes the sixth active section 2133 in the second active pattern 213 of the first reset transistor T3; the number 264 refers to the fifth via hole that penetrates the interlayer dielectric layer 26, the second gate insulation layer 24 and the first gate insulation layer 22, the fifth via hole 264 exposes the active pattern 215 of the data insertion transistor T5; the number 265 refers to the sixth via hole that penetrates the interlayer dielectric layer 26, the sixth via hole 265 exposes the first initialization signal line 252; the number 266 refers to the seventh via hole that penetrates the interlayer dielectric layer 26, the second gate insulation layer 24 and the first gate insulation layer 22, the seventh via hole 266 exposes the third active section 2113 of the first active pattern 211; the number 267 refers to the eighth via hole that penetrates the interlayer dielectric layer 26 and the second gate insulation layer 24, the eighth via hole 267 exposes the first polar plate 234 of the storage capacitance Cst; the number 268 refers to the ninth via hole that penetrates the interlayer dielectric layer 26, the ninth via hole 268 exposes the second polar plate 253 of the storage capacitance Cst; the number 269 refers to the tenth via hole that penetrates the interlayer dielectric layer 26, the second gate insulation layer 24 and the first gate insulation layer 22, the tenth via hole 269 exposes the active pattern 216 of the second light control transistor T6; the number 270 refers to the eleventh via hole that penetrates the interlayer dielectric layer 26, the second gate insulation layer 24 and the first gate insulation layer 22, the eleventh via hole 270 exposes the active pattern 214 of the first light control transistor T4.

Figure 8:
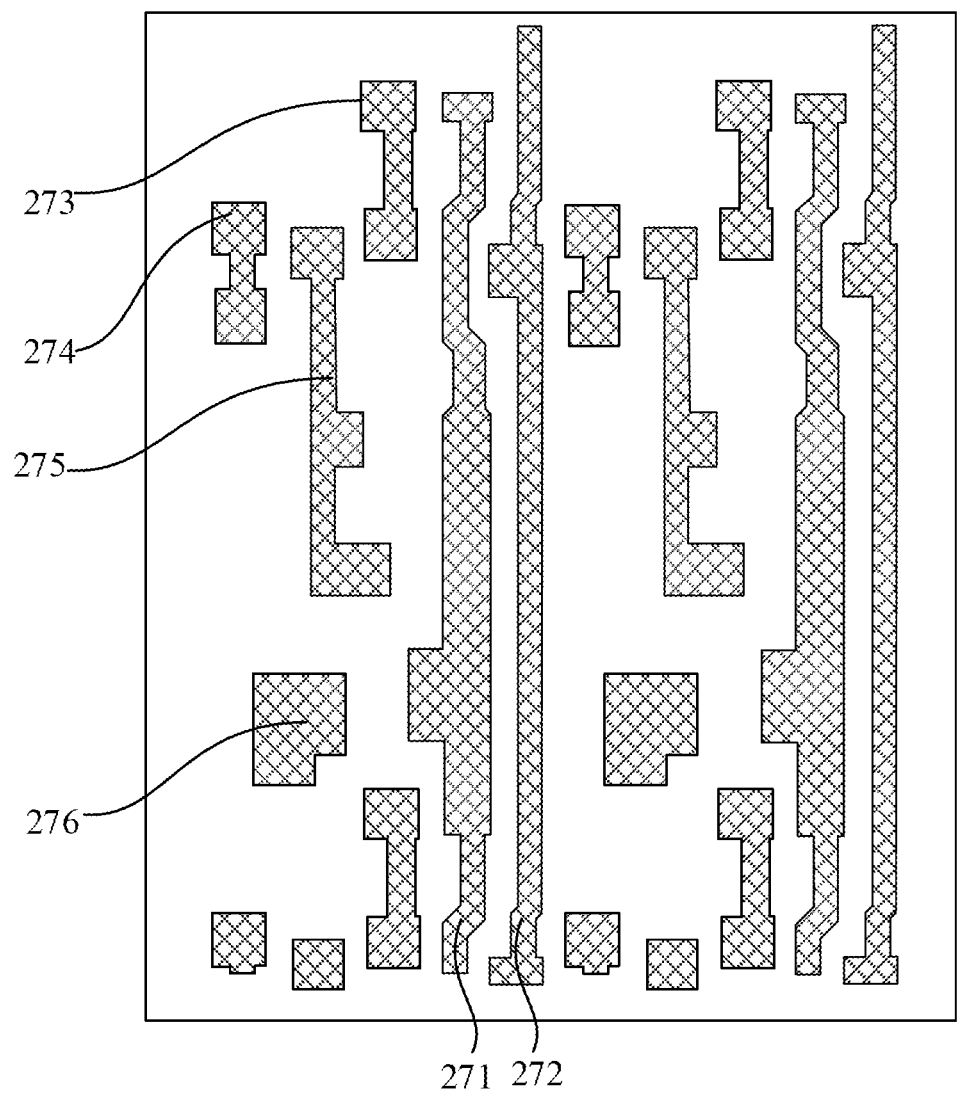
FIG. 8 illustrates a schematic structure of a source-drain electrode layer of the display panel of the embodiment of the disclosure.

As referring to FIG. 8, the first source signal line 271, the data line 272, the first connection section 273, the second connection section 274, the third connection section 275 and the fourth connection section 276 are all located on the source-drain electrode layer, and there is no overlapping area exists between the orthogonal projections of the first source signal line 271, the data line 272, the first connection section 273, the second connection section 274, the third connection section 275 and the fourth connection section 276 on the substrate 10.

Wherein, the first source signal line 271 is connected with the second polar plate 253 of the storage capacitance Cst by the ninth via hole 268, the first source signal line 271 is also connected with the active pattern 214 of the first light control transistor T4 by the eleventh via hole 270; the data line 272 is connected with the active pattern 215 of the data insertion transistor T5 by the fifth via hole 264; the first connection section 273 is connected with the second initialization signal line 251 by the eleventh via hole 260, the first connection section 273 is also connected with the sixth active section 2133 in the second active pattern 213 of the first reset transistor T3 by the fourth via hole 263; the second connection section 274 is connected with the active pattern 217 of the second reset transistor T7 by the second via hole 261, the second connection section 274 is also connected with the first initialization signal line 252 by the sixth via hole 265; the third connection section 275 is connected with the fourth active section 2131 in the second active pattern 213 of the first reset transistor T3 by the third via hole 262, the third connection section 275 is connected with the third active section 2113 in the first active pattern 211 of the compensating transistor T1 by the seventh via hole 266, the third connection section 275 is also connected with the first polar plate 234 of the storage capacitance Cst by the eighth via hole 267; the fourth connection section 276 is connected with the active pattern 216 of the second light control transistor T6 by the tenth via hole 269.

Figure 9:
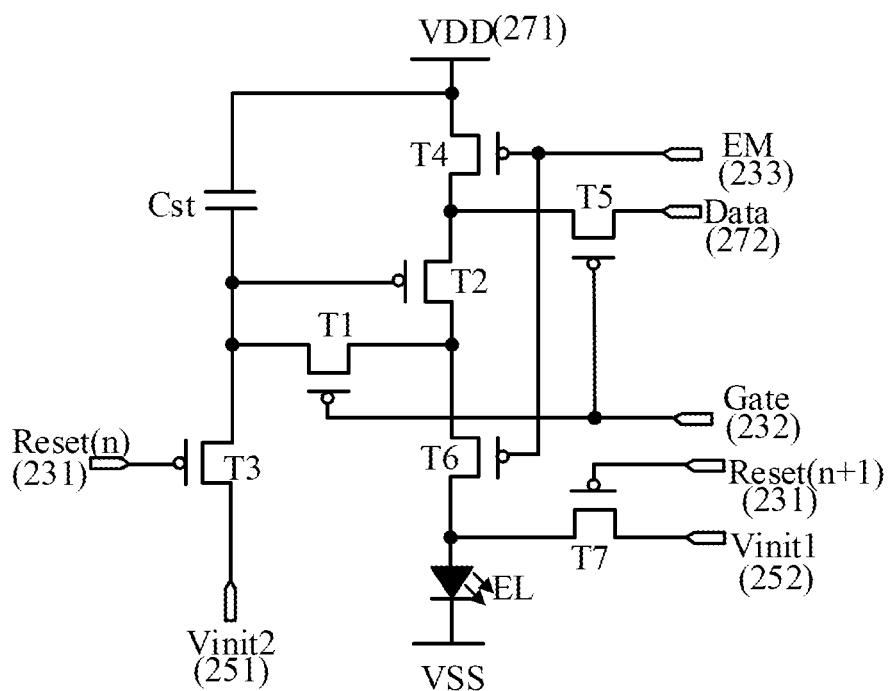
FIG. 9 illustrates an equivalent circuit diagram according to the each of the subpixels of the display panel of the embodiment of the disclosure.

The source-drain electrode layer shown in the FIG. B is placed to the structure shown in the FIG. 7, to obtain the display panel shown in the FIG. 2, according to the connection relationship of each of the films or layers, an equivalent circuit diagram according to each of the subpixels 20 of the display panel shown in the FIG. 2 is illustrated in the FIG. 9.

Wherein, the gate of the compensating transistor T1 is controlled by the gate line 232, the first polar of the compensating transistor T1 is connected with the second polar of the drive transistor T2, the second polar of the compensating transistor T1 is connected with the gate of the drive transistor T2 and the first polar plate 234 of the storage capacitance Cst; the second polar plate 253 of the storage capacitance Cst is connected with the first source signal line 271; the gate of the first reset transistor T3 is controlled by the reset signal line 231, the first polar of the first reset transistor T3 is connected with the second initialization signal line 251, the second polar of the first reset transistor T3 is connected with the second polar of the compensating transistor T1; the gate of the first light control transistor T4 is controlled by the light control signal line 233, the first polar of the first light control transistor T4 is connected with the first source signal line 271, the second polar of the first light control transistor T4 is connected with the first polar of the drive transistor T2; the gate of the data insertion transistor T5 is controlled by the gate line 232, the first polar of the data insertion transistor T5 is connected with the data line 272, the second polar of the data insertion transistor T5 is connected with the first polar of the drive transistor T2; the gate of the second light control transistor T6 is controlled by the light control signal line 233, the first polar of the second light control transistor T6 is connected with the second polar of drive transistor T2, the second polar of the second light control transistor T6 is connected with the first polar of the light emitting section EL; the gate of the second reset transistor T7 is controlled by the reset signal line 231, the first polar of the second reset transistor T7 is connected with the first initialization signal line 252, the second polar of the second reset transistor T7 is connected with the first polar of the light emitting section EL; and the second polar of the light emitting section EL with a second source line.

It should be noted that after obtaining the display panel shown in the FIG. 2, a anode, a pixel definition layer, a luminescent layer and a cathode are necessary to be formed in sequence, and so on, the light emitting section EL shown in the FIG. 9 includes the stacked disposed anode, the luminescent layer and the cathode, the first polar of the light emitting section EL refers to the anode, the second polar of the light emitting section EL refers to the cathode.

Figure 10:
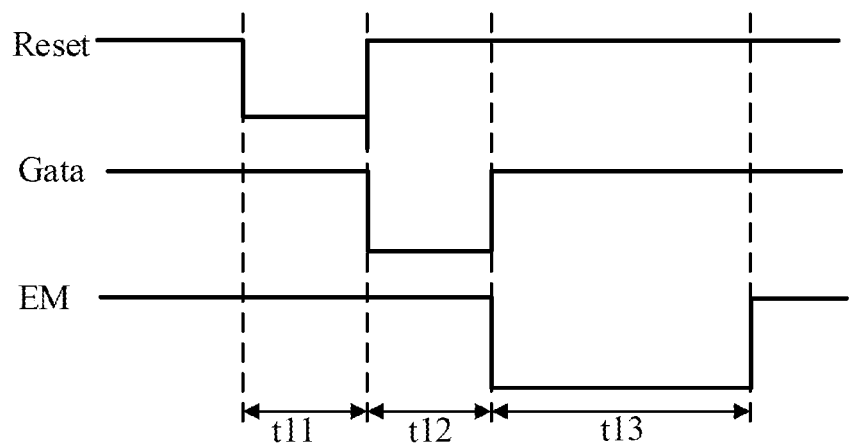
FIG. 10 illustrates a driving sequence diagram of the circuit shown in FIG. 9.

As referring to FIG. 10, for the subpixels 20 of the row n, at the first stage t11, a reset signal Reset inputted by the reset signal line 231 of the row n is a low level signal, it makes the first reset transistor T3 be conducting, then a second initialization signal Vinit2 inputted by the second initialization signal line 251 resets the gate of the storage capacitance Cst and the drive transistor T2; at this time, the drive transistor T2 is conducting, a gate signal Gate inputted by the gate line 232 and a light control signal EM inputted by the light control signal line 233 are all the high level signals, so that the compensating transistor T1, the first light control transistor T4, the data insertion transistor T5 and the second light control transistor T6 are all off.

At the second stage t12, a gate signal Gate inputted by the gate line 232 is a low level signal, it makes the compensating transistor T1 and the data insertion transistor T5 be conducting, the drive transistor T2 is also conducting, so a data signal Data provided by the data line 272 charges the storage capacitance Cst by the data insertion transistor T5, the drive transistor T2 and the compensating transistor T1, it makes the gate voltage of the drive transistor T2 be Vdata+Vth, the Vth refers to the threshold voltage of the drive transistor T2, the Vdata refers to the voltage of the data signal Data. Since the reset signal Reset inputted by the reset signal line 231 of the row n and light control signal EM inputted by the light control signal line 233 are all the high-level signal, so that the first reset transistor T3, the first light control transistor T4 and the second light control transistor T6 are all off.

At this time, in the subpixels 20 of the row n, the reset signal line 231 that connected to the second reset transistor T7 is the reset signal line 231 in the subpixels 20 of the row n+1, and the reset signal line 231 connected to the second reset transistor T7 is connected with the gate line 232 in the subpixels 20 of the row n, therefore, at the second stage t12, the reset signal Reset inputted by the reset signal line 231 in the subpixels 20 of the row n+1 is also a low-level signal, it makes the second reset transistor T7 be conducting, then the first initialization signal Vinit1 inputted by the first initialization signal line 252 resets the first polar of the light emitting section EL.

At the third stage t13, the light control signal EM inputted by the light control signal line 233 is a low-level signal, it makes the first light control transistor T4 and the second light control transistor T6 turning on, then by the first light control transistor T4, the drive transistor T2 and the second light control transistor T6 provide a driving current to the first polar of the light emitting section EL for driving the light emitting section EL to emit light, and, the magnitude of the driving current is related to the voltage of the high-level voltage signal VDD provided by the first source signal line 271 and the voltage Vdata of the data signal Data, at this time, since the reset signals Reset inputted by the reset signal line 231 of the row n and gate signals Gate inputted by the gate line 232 are all high-level signals, the first reset transistor T3, the compensating transistor T1, the data insertion transistor T5 and the second reset transistor T7 are all off.

It should be noted that the second source line is used to provide low-level voltage signal VSS to the cathode of the light emitting section EL; the above mentioned driving process is illustrated with the examples that the compensating transistor TL, the drive transistor T2, the first reset transistor T3, the first light control transistor T4, the data insertion transistor T5, the second light control transistor T6 and the second reset transistor T7 are all a P-type transistor, they are conducting when the gate is low level, and they are off when the gate are high level. Certainly, the compensating transistor T1, the drive transistor T2, the first reset transistor T3, the first light control transistor T4, the data insertion transistor T5, the second light control transistor T6 and the second reset transistor T7 may also be a N-type transistor, they are conducting when the gate is high level, and they are off when the gate are low level. Additionally, in order to distinguish the two polars of the transistor other than the gate, the source polar is named the first pole, and the drain polar is named the second polar.

In the embodiments of the present disclosure, the gate line 232 in the subpixels 20 of the same row is interconnected, the reset signal line 231 in the subpixels 20 of the same row is interconnected, the light control signal line 233 in the subpixels 20 of the same row is interconnected, and the first initialization signal line 252 in the subpixels 20 of the same row is interconnected, the second initialization signal line 251 in the subpixels 20 of the same row is interconnected; the data line 272 in the subpixels 20 of the same column is interconnected, and the first source signal line 271 in the subpixel 20 of the same column is interconnected.

By connecting of the same trace that extends along the row direction in the subpixels 20 of the same row and the same trace that extends along the column direction in the subpixels 20 of the same column, the quantity of lead wires in the fan out area of the display panel is reduced, and the area of the fan out area is smaller.

When the display panel shown in the FIG. 2 is needed to be formed, it needs to form the compensating transistor T1, the drive transistor T2, the storage capacitance Cst, the first initialization signal line 252, the first reset transistor T3, the first light control transistor T4, the data insertion transistor T5, the second light control transistor T6 and the second reset transistor T7, and the second initialization signal line 251, the reset signal line 231, the gate line 232, the light control signal line 233, the first source signal line 271 and the data line 272 corresponding to each of the subpixels 20 on the substrate 10.

Specifically, the active layer shown in the FIG. 4 is first formed on the substrate 10 by the composition process, the active layer comprises the active patterns of each of the transistors, then, the first gate insulation layer 22 coating the active layer and the substrate 10 is formed, the first gate layer is formed on the first gate insulation layer 22 by the composition process, so that the structure shown in the FIG. 5 is obtained, the first gate layer comprises the reset signal line 231, the gate line 232, the first polar plate 234 of the storage capacitance Cst and the light control signal line 233; then, the second gate insulation layer 24 coating the first gate layer and the first gate insulation layer 22 is formed, the second gate layer is formed on the second gate insulation layer 24 by the composition process, so that the structure shown in the FIG. 6 is obtained, the second gate layer comprises the first initialization signal line 252, the second initialization signal line 251 and the second polar plate 253 of the storage capacitance Cst; then, the interlayer dielectric layer 26 coating the second gate layer and the second gate insulation layer 24 is formed, some perforative via holes are formed, such as the first via hole 260, the second via hole 261, the third via hole 262, the fourth via hole 263, the fifth via hole 264, the sixth via hole 265, the seventh via hole 266, the eighth via hole 267, the ninth via hole 268, the tenth via hole 269 and the eleventh via hole 270 that are shown in the FIG. 7; finally, the source-drain electrode layer shown in the FIG. 8 is formed on the interlayer dielectric layer 26 by the composition process, so that the display panel shown in the FIG. 2 is obtained, the source-drain electrode layer comprises first source signal line 271, the data line 272, the first connection section 273, the second connection section 274, the third connection section 275 and the fourth connection section 276.

After the display panel shown in the FIG. 2 is formed, it also needs to form a passivation layer coating the source-drain electrode layer and the interlayer dielectric layer 26, and a flat layer located on the passivation layer away from the side of the source-drain electrode layer, then, a anode layer and a pixel definition layer are formed on the flat layer, the pixel definition layer includes a pixel opening that exposes the anode layer, which forms an organic functional layer in the pixel opening, then, a cathode layer coating the pixel definition layer and the organic functional layer is also formed, finally, a packaging layer coating the cathode layer is formed, so that the display panel is formed completely, the packaging layer may be an organic packaging layer, a inorganic packaging layer, or, a laminated structure of the organic packaging layer and the inorganic packaging layer.

In the embodiments of the present disclosure, the first active pattern of the compensating transistor is changed, to make the first active pattern include the first active section, the second active section and the third active section which are sequentially connected. The second active section extends along a first direction, the extension directions of the first active section and the third active section are connected with the first direction, and an overlapping area exist between an orthogonal projection of the first initialization signal line on the substrate and an orthogonal projection of the second active section on the substrate. It is formed the coupling capacitance directly by the overlapping of the first initialization signal line with the first active pattern of the compensating transistor, at this time, the connection section is not need to be disposed additionally. By optimizing the circuit design of the subpixels, the circuit space layout of each of the subpixels is simplified. Accordingly, the space occupied by the circuit layout of each of the subpixels is saved, and the aperture ratio of each of the subpixel is increased.

The embodiments of the present disclosure further disclose a display device, includes the above-mentioned display panel.

In addition, the display device includes a drive IC bound to the trace in the display panel and a TCON (Timer Control Register) connected to the drive IC.

In addition, the specific structure of the display panel in the display device may be referred to the description of the above display panel, and the effect is similar to that of the above display panel. In order to avoid duplication, which is not repeated here.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it may be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail by referring to the above embodiments, a person skilled in the art should understand that he may still modify the technical solutions set forth by the above embodiments, or make equivalent substitutions to section of the technical features of them. However, those modifications or substitutions do not make the essence of the corresponding technical solutions depart from the spirit and scope of the technical solutions of the embodiments of the present disclosure.

The invention claimed is:

1. A display panel, wherein, the display panel comprises:
a substrate; and
a plurality of subpixels, disposed on the substrate, each of the subpixels comprises:
   a compensating transistor;
   a drive transistor;
   a storage capacitance; and
   a first initialization signal line;
   wherein, a first polar of the compensating transistor is connected with a second polar of the drive transistor, a second polar of the compensating transistor is connected with a gate of the drive transistor and a first polar plate of the storage capacitance, respectively;
   a first active pattern of the compensating transistor comprises a first active section, a second active section and a third active section which are sequentially connected, the second active section extends along a first direction, and extension directions of the first active section and the third active section intersect with the first direction; and
   the first initialization signal line extends along the first direction, and an overlapping area exist between an orthogonal projection of the first initialization signal line on the substrate and an orthogonal projection of the second active section on the substrate.

2. The display panel according to claim 1, wherein, the orthogonal projection of the second active section on the substrate is covered by the orthogonal projection of the first initialization signal line on the substrate.

3. The display panel according to claim 1, wherein, an overlapping area exist between the orthogonal projection of the first initialization signal line on the substrate and an orthogonal projection of the first active section and an orthogonal projection of the third active section on the substrate.

4. The display panel according to claim 1, wherein, the each of the subpixels further comprises: a gate line, a reset signal line, a second initialization signal line, a light control signal line, a first source signal line and a data line;
the gate line, the reset signal line, the second initialization signal line and the light control signal line all extend along the first direction, the first source signal line and the data line both extend along a second direction, the second direction intersects with the first direction.

5. The display panel according to claim 4, wherein, the reset signal line is located between the first initialization signal line and the second initialization signal line, the first initialization signal line is located between the reset signal line and the gate line, the gate line is located between the first initialization signal line and the light control signal line.

6. The display panel according to claim 4, wherein, a gate of the compensating transistor is controlled by the gate line, and the gate of the compensating transistor refers to a section of the gate line that is overlapped with the first active section and the third active section.

7. The display panel according to claim 4, wherein, at a position where the first active section and the second active section are connected, the first initialization signal line is provided with a first convex section facing the gate line and a second convex section back away from the gate line; and
widths of the first initialization signal line are equal at positions other than the position where the first active section and the second active section are connected along the second direction.

8. The display panel according to claim 4, wherein, the each of the subpixels further comprises:
a first reset transistor;
wherein, a gate of the first reset transistor is controlled by the reset signal line, a first polar of the first reset transistor is connected with the second initialization signal line, a second polar of the first reset transistor is connected with the second polar of the compensating transistor.

9. The display panel according to claim 8, wherein, the first reset transistor refers to a dual gate transistor;
a second active pattern of the first reset transistor comprises a fourth active section, a fifth active section and a sixth active section which are sequentially connected, the fifth active section extends along the first direction, and extension directions of the fourth active section and the sixth active section both intersect with the first direction; and
the gate of the first reset transistor refers to a section of the reset signal line that is overlapped with the fourth active section and the sixth active section.

10. The display panel according to claim 9, wherein, an orthogonal projection of the second active pattern on the substrate is not overlapped with an orthogonal projection of the first source signal line on the substrate.

11. The display panel according to claim 8, wherein, each of the subpixels further comprises:
a second light control transistor and a light emitting section;
wherein, a gate of the second light control transistor is controlled by the light control signal line, a first polar of the second light control transistor is connected with the second polar of the drive transistor, a second polar of the second light control transistor is connected with a first polar of the light emitting section.

12. The display panel according to claim 11, wherein, each of the subpixels further comprises:
a second reset transistor;
wherein, a gate of the second reset transistor is controlled by the reset signal line, a first polar of the second reset transistor is connected with the first initialization signal line, a second polar of the second reset transistor is connected with the first polar of the light emitting section.

13. The display panel according to claim 12, wherein, in the subpixels of row n, the reset signal line connected by the first reset transistor is the reset signal line in the subpixels of row n, the reset signal line connected by the second reset transistor is the reset signal line in the subpixel of row n+1, and the reset signal line connected by the second reset transistor is connected with the gate line in the subpixels of row n; n is a positive integer greater than 0.

14. The display panel according to claim 4, wherein, each of the subpixels further comprises:
a first light control transistor;
wherein, a gate of the first light control transistor is controlled by the light control signal line, a first polar of the first light control transistor is connected with the first source signal line, a second polar of the first light control transistor is connected with a first polar of the drive transistor; and
the first source signal line is also connected with a second polar plate of the storage capacitance.

15. The display panel according to claim 4, wherein, each of the subpixels further comprises:
a data insertion transistor;
wherein, a gate of the data insertion transistor is controlled by the gate line, a first polar of the data insertion transistor is connected with the data line, a second polar of the data insertion transistor is connected with the first polar of the drive transistor.

16. The display panel according to claim 4, wherein, the first active pattern is located on an active layer, first polar plates of the gate line, the reset signal line, the light control signal line and the storage capacitance are all located on a first gate layer, second polar plates of the first initialization signal line, the second initialization signal line and the storage capacitance are located on a second gate layer, the first source signal line and the data line are located on a source-drain electrode layer; and
a first gate insulation layer is disposed between the first gate layer and the active layer, a second gate insulation layer is disposed between the second gate layer and the first gate layer, an interlayer dielectric layer is disposed between the source-drain electrode layer and the second gate layer, and the source-drain electrode layer is located on a side of the interlayer dielectric layer away from the substrate.

17. The display panel according to claim 4, wherein, the gate lines in the subpixel of the same row are interconnected, the reset signal lines in the subpixel of the same row are interconnected, the light control signal lines in the subpixel of the same row are interconnected, the first initialization signal lines in the subpixel of the same row are interconnected, the second initialization signal lines in the subpixel of the same row are interconnected; and
the data lines in the subpixel of the same column are interconnected, the first source signal lines in the subpixel of the same column are interconnected.

18. The display panel according to claim 1, wherein, the extension directions of the first active section and the third active section are parallel to each other; or,
the extension direction of the first active section is a third direction, the extension direction the third active section is a fourth direction, the third direction intersects with the fourth direction.

19. A display device, comprises a display panel, wherein, the display panel comprises:
a substrate; and
a plurality of subpixels, disposed on the substrate, each of the subpixels comprises:
a compensating transistor;
a drive transistor;
a storage capacitance; and
a first initialization signal line;
wherein, a first polar of the compensating transistor is connected with a second polar of the drive transistor, a second polar of the compensating transistor is connected with a gate of the drive transistor and a first polar plate of the storage capacitance, respectively;
a first active pattern of the compensating transistor comprises a first active section, a second active section and a third active section which are sequentially connected, the second active section extends along a first direction, and extension directions of the first active section and the third active section intersect with the first direction; and the first initialization signal line extends along the first direction, and an overlapping area exist between an orthogonal projection of the first initialization signal line on the substrate and an orthogonal projection of the second active section on the substrate.

20. The display device according to claim 19, wherein, the orthogonal projection of the second active section on the substrate is covered by the orthogonal projection of the first initialization signal line on the substrate.

* * * * *